United States Patent [19]

Paulson

[11] Patent Number: 5,235,184

[45] Date of Patent: Aug. 10, 1993

[54] HIGHLY STABLE LOW NOISE CCD SPECTROGRAPH

[75] Inventor: Albert M. Paulson, Eatontown, N.J.

[73] Assignee: Spex Industries, Inc., Edison, N.J.

[21] Appl. No.: 791,359

[22] Filed: Nov. 14, 1991

[51] Int. Cl.$^5$ .............................................. H01J 7/24
[52] U.S. Cl. ..................................... 250/238; 250/239
[58] Field of Search ...................... 250/238, 239, 338.1

[56] References Cited

U.S. PATENT DOCUMENTS

| | | | |
|---|---|---|---|
| 2,727,119 | 12/1955 | Thomson ............................ | 250/238 |
| 3,103,587 | 9/1963 | Ure, Jr. et al. ...................... | 250/238 |
| 3,167,653 | 1/1965 | Rumble et al. ...................... | 250/238 |
| 3,227,885 | 1/1966 | Hirai et al. .......................... | 250/238 |
| 3,259,865 | 7/1966 | Lederhandler et al. ............. | 250/238 |

OTHER PUBLICATIONS

Petrick: Generalized approach to cooling charge-coupled devices using thermoelectric coolers, Optical Engineering, vol. 26, No. 10, Oct. 1987, pp. 965-971.

*Primary Examiner*—David C. Nelms
*Attorney, Agent, or Firm*—Handal & Morofsky

[57] ABSTRACT

A low temperature solid state light detecting system is disclosed. The same incorporates a source of cooling and an electrical light detector. A heat conducting member extends from the detector chip to the source of cooling. A vacuum chamber contains the light detector. The chamber has a window for permitting light to fall on the electrical light detector. A plurality of electrical feedthrough devices are mounted on the chamber for coupling electricity from inside the chamber to the outside of the chamber. A plurality of bare wires extends from the detector to the feedthrough devices positioned on the housing.

27 Claims, 7 Drawing Sheets

HIGHLY STABLE LOW NOISE CCD SPECTROGRAPH

TECHNICAL FIELD

The present invention relates to cold charged coupled device detection arrays of the type which utilize liquid nitrogen to cool the detector in order to optimize operating characteristics over extended detection intervals where Johnson noise caused by thermally released electrons tends to accumulate and be held in the array by the system's operating voltage bias.

BACKGROUND

Current optical analysis instrumentation typically involves the use of an electronic detector for detecting the photon output at various wavelengths produced by an optical analysis instrument, such as a spectrometer or monochrometer. While these systems have reached an exceedingly high degree of sophistication and sensitivity, current practice does suffer from a number of limitations and inconveniences.

One class of devices analyzes light by breaking it into its constituent wavelengths or colors, and then measuring the amplitude of the light at the various wavelengths. Spectrometers perform this function by presenting at their output a spectrum of wavelengths where the position of the output light deviates from a reference wavelength by a distance which is a direct function of the wavelength.

One type of electronic detector which is used to quantitatively evaluate the amount of light at each wavelength is the charge coupled device (CCD) detector array. Generally, this device comprises an array of solid state device photodetectors which cover an area which corresponds to the area on which the spectrometer outputs light.

In order to reach a high degree of sensitivity and good signal-to-noise ratio, such electronic detectors are operated in an extremely cold environment which minimizes noise. More particularly, during operation, semiconductor junctions have "traps" which can tie up an electron or a hole, causing it to be unavailable for recombination. During operation, if an electron is caused to leave the valence band, a hole remains. If, however, the hole becomes trapped, it will not be available for electron recombination. Similarly, an electron trap in the conduction band will make an electron unavailable for recombination. The result of these two effects is to inhibit the conduction process in the device, increase response time and, in the case of electron traps, to reduce sensitivity.

A consideration in the design of such devices is the expected ambient temperature. Generally, temperature is the equivalent of kinetic energy in the various atoms of the material of the semiconductor detector. Increasing temperature results in imparting this kinetic energy to electrons, freeing them up to interfere with the detection process which depends upon the detection of free electrons created by photons of incident light, in order to measure the intensity of incident light. If the temperature of a detector is relatively high, and the intensity of light to be detected is relatively low, the electrons released by atoms due to the relatively high temperature create a thermal noise which effectively decreases the output signal-to-noise ratio of the device and thus reduce effective system sensitivity.

In the case where exposure times are very long, thermal noise tends to accumulate in the charge coupled device array, thus effectively masking the light input into the detector over what may be a period of minutes or even hours.

In a typical spectrographic application, the CCD detector is placed in a housing which maintains the detector in a vacuum. In addition, part of the housing forms a Dewar flask, which includes a compartment for liquid nitrogen which is typically at 77° Kelvin. In this sort of application, the CCD detector used typically has an operating characteristic which is optimized at 140° Kelvin. However, from a practical standpoint, 140° Kelvin is not easy to achieve for extended time periods given the present state of spectrographic CCD housing system technology.

It is also desirable that the temperature of the detector be maintained at a constant level during operation. Prior art systems typically incorporate a heater element for heating up the CCD detector and keeping it from getting too cold. However, such heater elements are, as a practical matter, never used because of the inability of commercial systems to maintain the desired 140° Kelvin temperature.

SUMMARY OF THE INVENTION

In accordance with the invention, it has been found that prior system failures stem from numerous factors which cooperate to have a surprisingly significant effect on performance under extreme circumstances. More particularly, prior art systems tend to stress the use of plastic insofar as this material tends not to transmit heat. However, in accordance with the present invention, it has been found that plastic tends to leach out volatile materials, probably comprising plasticizers, oils, and accumulated environmental humidity into the vacuum, thus partially destroying it and providing for convective and conductive heat loss. In contrast, in accordance with the invention, the use of plastic is minimized, for example, through the use of bare wires in combination with a configuration which substantially eliminates the possibility of accidental shorting.

This is in contrast to prior art systems where, typically, a detector device is mounted on a circuit board, made of a synthetic material and having a printed circuit thereon.

Typically, the output wires of the printed circuit are bundled and sent to an output device. Typical of such devices on the market today is that manufactured by Astromed Corporation. In this device, very thin copper wires forming the umbilical between the circuit board and the outside world are run a distance of several inches in the form of a bundle of insulated conductors. This bundle is then fed through a single output port which is vacuum sealed.

A typical system could involve twenty or more such conductors connecting the detector system to the outside world. Accordingly, such conductors also represent a substantial input heat load into the cooling system. This load takes several forms. Firstly, the conductors provide a path for conducting heat from the outside world into the system. Secondly, the conductors carry, in certain cases, relatively large amounts of electrical power and thus act as heaters. Thirdly, to the extent that convection currents, radiation and conduction are present in the system, the wires tend to accumulate the heat and channel it toward the detector assembly.

In order to minimize these effects, the typical design approach has been to use insulated copper wires of extremely thin diameter which, because they are copper, have sufficient electrical conductivity even though they are very thin. While the use of other materials, such as manganin, wire has been suggested, for example, in Petrick article in Optical Engineering, Volume 26, No. 10 (October 1987), the bundling of wires to exit through a single output port does not allow sufficiently short conductors to achieve a high degree of performance.

In accordance with the invention, the above-identified problems are addressed by the use of a radially-configured array of bare manganin wires which exit through a plurality of vacuum-sealed electrical ports, with bundling occurring, if at all, outside the Dewar flask. The inventive substitution of the radial-configuration for the bundled configuration fulfills the dual objectives of reducing wire length and eliminating the need for a substantial number of wire insulation tubes. As noted above, the reduction in the amount of electrical insulation reduces the outgassing problem which, in addition to causing loss of vacuum, can result in the leaching of humidity into the system. This can also result in condensation freezing on the surface of the CCD detector and damage of the same. Such damage is particularly likely because in order to achieve optical sensitivity, the CCD detector has its active silicon face completely exposed to the inside of the Dewar flask. In addition, outgassing is further reduced by the use of aluminum in place of the customary stainless steel in the CCD cooling Dewar housing. Yet additional performance is provided by the shorter conductor lengths involved in this configuration, which allow the use of manganin or other materials which put a far smaller heat load on the system.

Further, in accordance with the present invention, the use of a circuit board is eliminated because the wires are not bundled, and the circuit board becomes unnecessary and connections may be made directly between the coupling member which engages the point on the chip and the vacuum feedthrough members radially positioned along the outside of the housing.

At the same time, the provision of a radial-output coupling arrangement also has the advantage of keeping all connections at one end of the Dewar system. This compares to prior art systems which involve connection from one end of the Dewar, where the window coupling light onto the detector is positioned, to the other end of the Dewar where utilities are typically connected. Because all of the electronics in the system is on one side in the inventive configuration, the detector head may be removed and different detector heads substituted in order to optimize performance for various different types of operations. While the provision of a great number of feedthroughs would suggest that the integrity of the vacuum would be in jeopardy, experiments have shown that vacuum effectiveness can be maintained for several days as compared to the four or five hours typically encountered in the past. The problem of light leakage through the numerous vacuum feedthroughs is minimized by the provision of a suitable housing member which overlies the annular array of feedthroughs.

BRIEF DESCRIPTION OF THE DRAWINGS

Several ways of carrying out the invention are described in detail below with reference to drawings which illustrate only specific embodiments of the invention and in which.

BEST MODE FOR CARRYING OUT THE INVENTION

Figure 1:
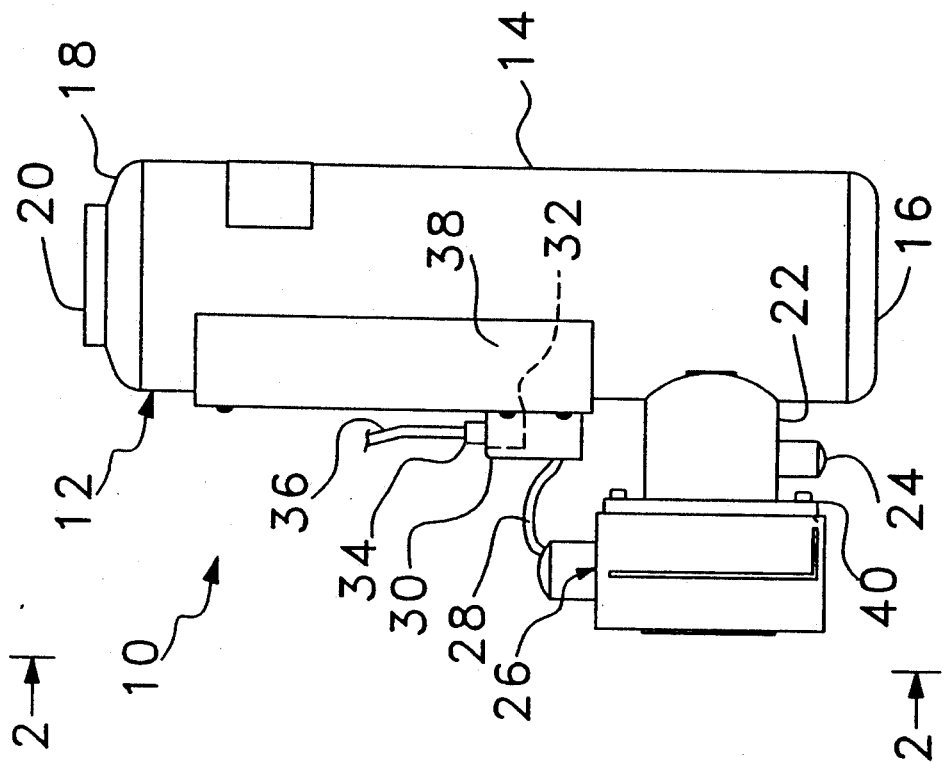
FIG. 1 is a view of a detector constructed in accordance with the present invention.

Referring to FIG. 1, an optical detector system 10 constructed in accordance with the present invention is illustrated. System 10 comprises an aluminum Dewar flask 12 which comprises an aluminum cylindrical main body 14. Body 14 is closed at one end by end aluminum cap 16 and at the other end by an aluminum fill cap closure 18 and a cap 20.

An aluminum coupling turret 22 is integral with cylindrical main body 14 and together with main body 14 defines an inner chamber which may be subjected to vacuum via an orifice 24. An aluminum detector housing 26 is secured to coupling turret 22 and sealed by O-ring 27.

The electrical wires which form the umbilical of the detection system exit the detector housing 26 as a wire bundle 28 and are supported within a bracket 30, which houses a twenty-five pin male connector 32 which mates with a cable-mounted female connector 34 which is connected to an output cable 36. Bracket 30 is mounted on a support housing 38 which in turn is supported by cylindrical main body 14.

Figure 2:
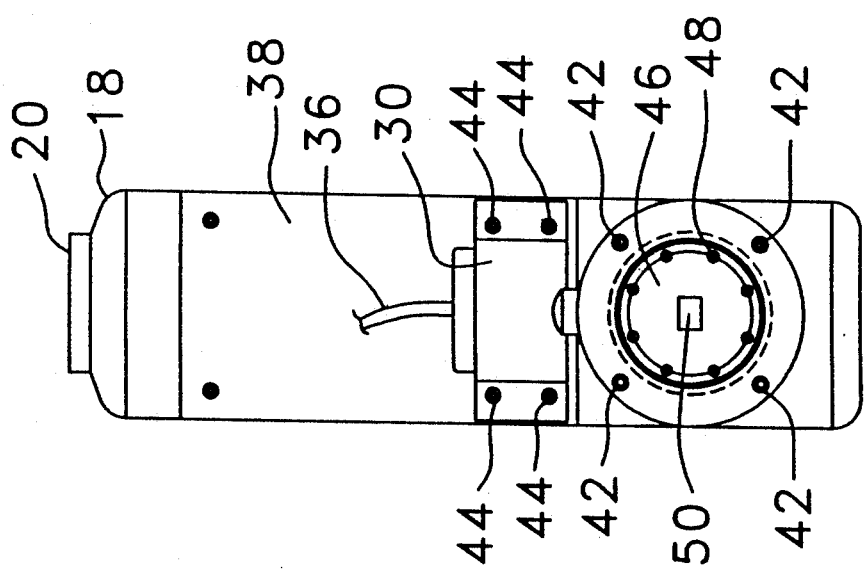
FIG. 2 is a cross-sectional view along lines 2—2 of FIG. 1.

As can be seen more clearly in FIG. 2, detector housing 26 is secured to the flange 40 of turret 22 by a plurality of bolts 42. Similarly, a bracket 30 is secured to support housing 38 by a plurality of bolts 44 which, like bolts 42, may be made of stainless steel. The outer housing is completed by a mask 46 which is secured to the detector housing 26 by a plurality of bolts 48. A window 50 is defined in the central portion of the mask 46.

Figure 3:
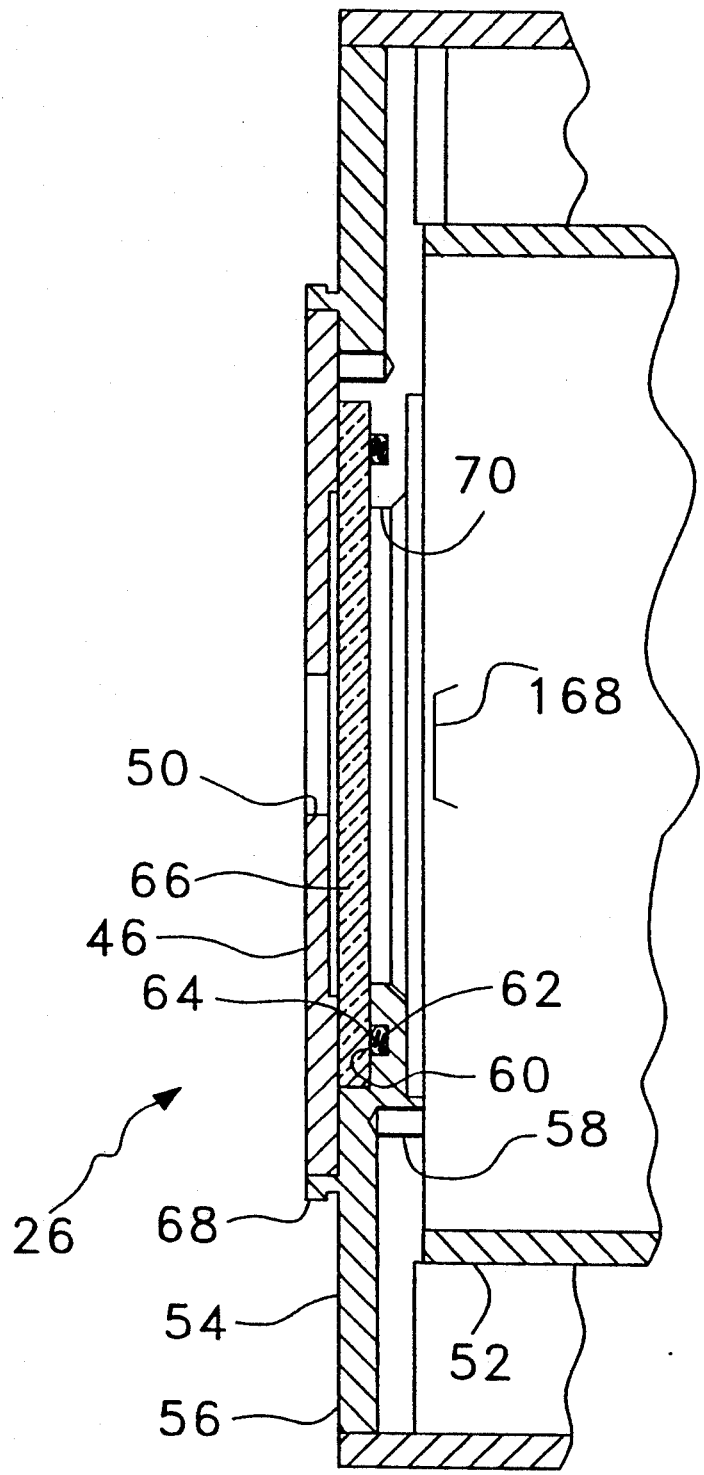
FIG. 3 is a detail of the light input arrangement of the inventive system.

Referring to FIG. 3, a more detailed view of the detector housing 26 is presented. For purposes of ease of illustration, the internal components of the detector are not illustrated in FIG. 3.

The detector housing 26 comprises cylindrical sidewalls 52 which terminate in a circular cover 54 with extending flange 56. A tapped hole 58 for receiving a cradle support member for supporting the CCD detector is provided in cover 54. Also machined into cover 54 is a recessed 60 which has machined into it an annular groove 62. An O-ring 64 made of rubber or similar material is received within annular groove 62, causing it to seal against transparent face 66 which is made of fused silica and is approximately 3 mm thick. Mask 46 is retained in position by annular guide fence 68 disposed in the outside space of cover 54. Cover 54 is integral with sidewalls 52. The application of pressure by mask 46 through transparent face 66 to O-ring 64 results in the compression of O-ring 64 resulting in maintaining a good vacuum seal closing orifice 70.

Figure 4:
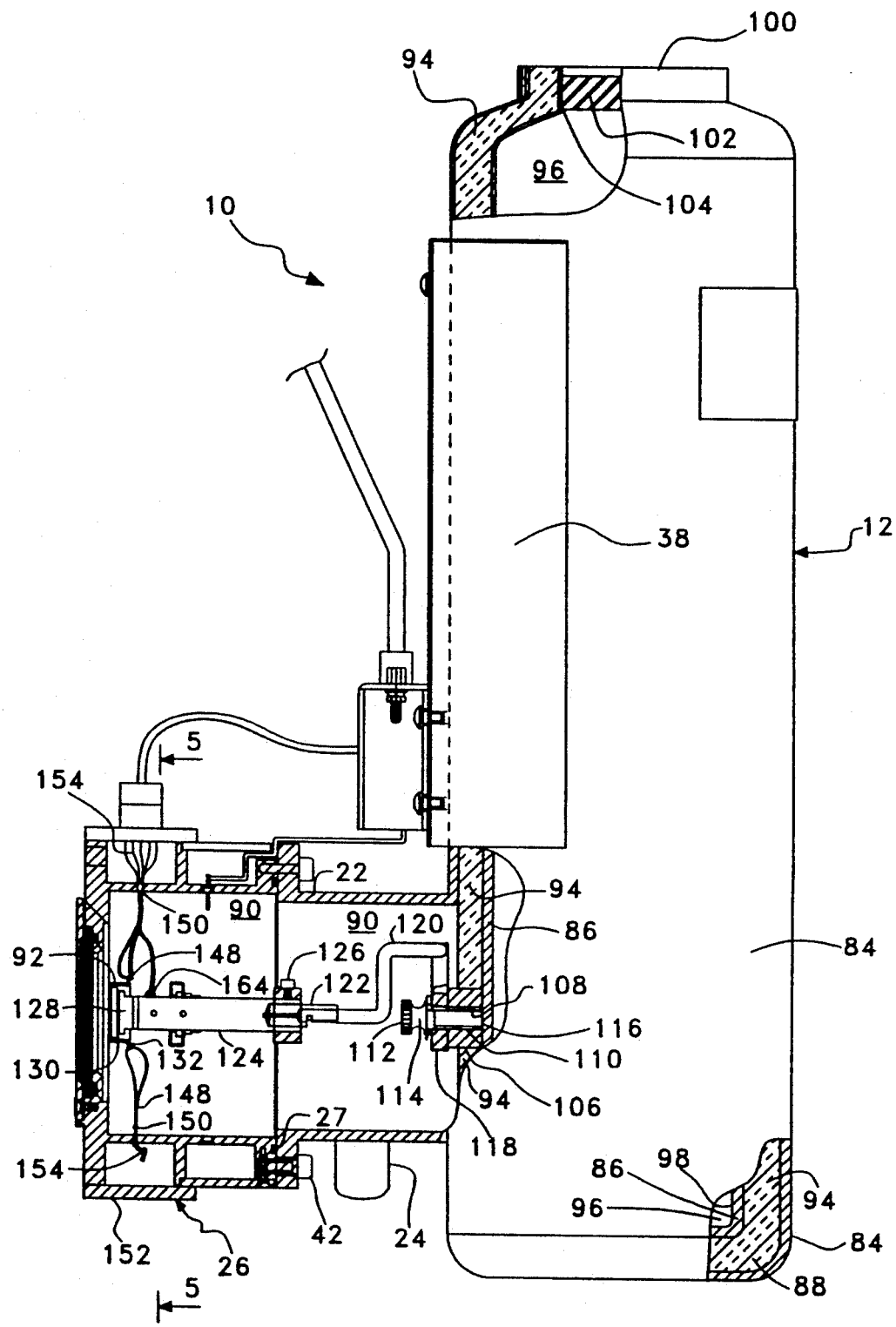
FIG. 4 is a detail showing the arrangement of the detector chip within the assembly of FIG. 3.

Referring to FIG. 4, the construction of the inventive system 10 is illustrated in somewhat greater detail. Generally, the Dewar flask 12 comprises an outer envelope 84 and an inner envelope 86. Both the inner and outer envelopes may be made of aluminum, notwithstanding its conductivity, in order to minimize the outgassing which occurs in other metals. Outgassing is a particular problem because the vacuum insulating chamber 88 inbetween inner envelope 86 and outer envelope 84 is part of a larger space which includes the space 90 which contains the CCD assembly 92. Insulation between the inner envelope 86 and the outer envelope 84 is enhanced by numerous layers 94 of metalized plastic, such as metalized Mylar. Such metalized layers 94 are provided in a conventional manner.

Liquid nitrogen 96 is contained within the chamber 98 defined within inner envelope 86. Nitrogen is introduced into chamber 98 in liquid form via orifice 100. After the introduction of liquid nitrogen into chamber 98, a foam plastic closure 102 is used to close the orifice. Closure 102 is supported by an annular ridge 104 on the inside of envelope 86.

A brass nut 106 is welded to the outside surface of inner envelope 86, as illustrated in FIG. 4. Nut 106 has a threaded inside surface 108 which matingly engages threads 110 on thumb screw 112. Thumb screw 112 also has a hole 114 which extends through it and allows the evacuation of air from the gap 116 between thumb screw 112 and inner envelope 86.

As noted above, a space 90 under vacuum is defined by the inside of the cylindrical detector housing 26 and the cylindrical coupling turret 22. Because of the effect of liquid nitrogen 96, inner envelope 86 will be brought to a very low temperature. This makes inner envelope 86, which is made of aluminum, an excellent cold "source" with the cold temperature of the liquid nitrogen being coupled via inner envelope 86 to nut 106. A heat sink coupler 118 which includes a hole through which thumb screw 112 passes is secured to nut 106 by thumb screw 112. Coupler 118 is in turn coupled to copper heat sink member 120 and copper heat sink coupler 122. Heat sink coupler 122 is inserted into a hole in heat sink rod 124 and secured therein by a bolt 126 which is screwed against coupler 122 to maintain it in position. Thus, rod 124 has a copper end platform 128 which is in facing contact with a CCD array 130 which is a single integrated circuit having a plurality of electrical contacts 132.

Thus, a direct path is provided for the conduction of heat away from CCD chip 130 toward the liquid nitrogen 96 in inner envelope 86.

In order to allow easier removal of detector housing 26 and the associated CCD, heat sink member 120 is made of a bundle of braided fine copper wires and is thus flexible, allowing housing 26 to be moved away from turret 22 after the removal of screws 40. This allows the user to loosen set bolt 126 and permit removal of the assembly.

Figure 5:
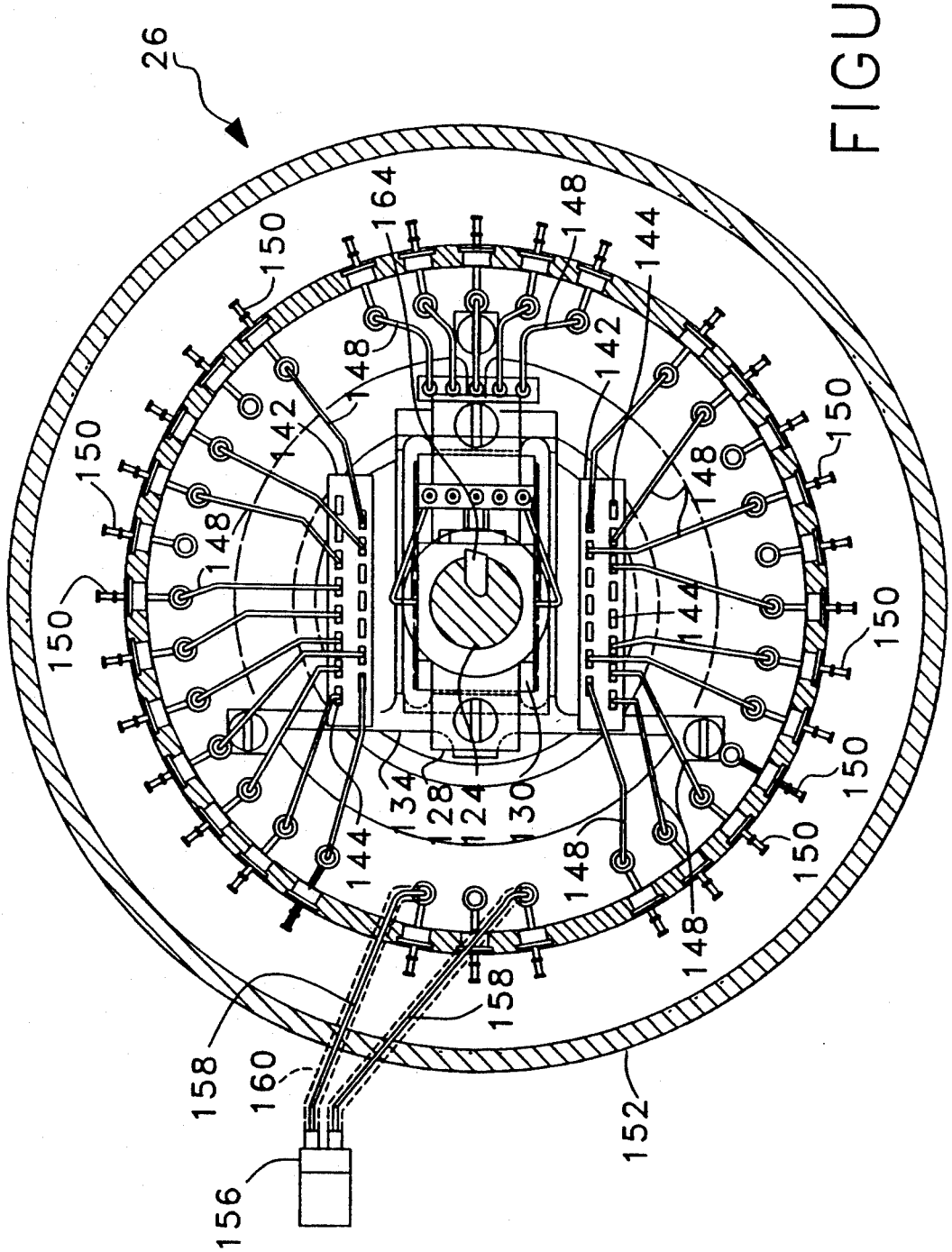
FIG. 5 is a view along the lines 5—5 of FIG. 4, illustrating the inventive configuration of the CCD detector arrangement.
Figure 6:
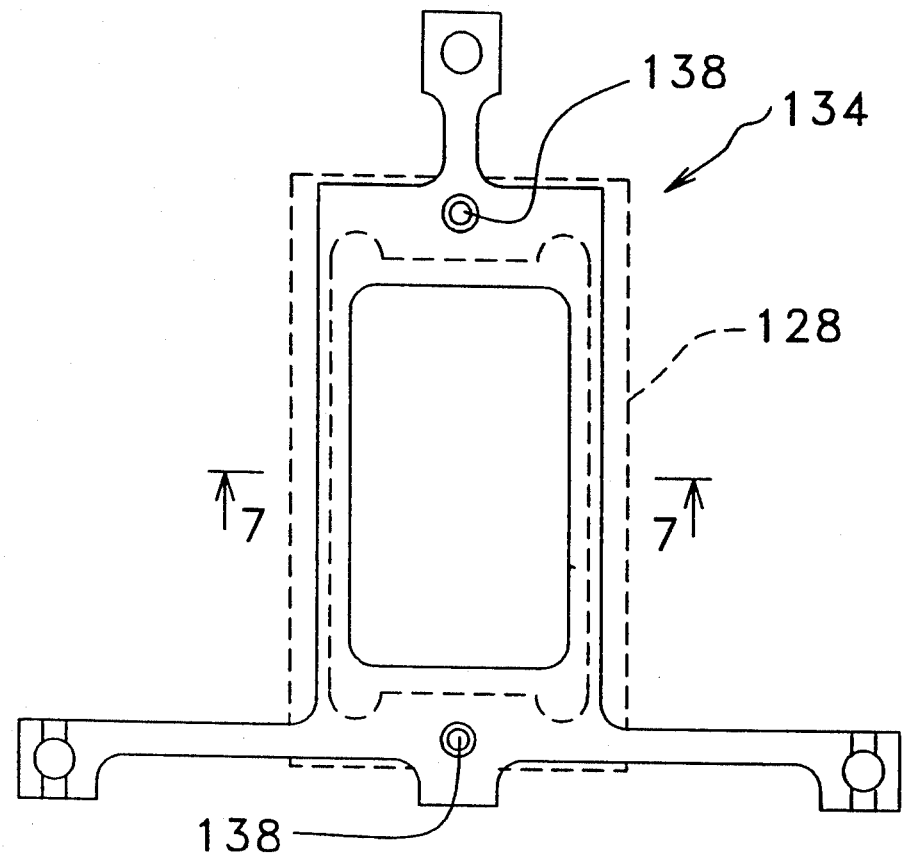
FIG. 6 is a detail of the cradle supporting the CCD chip.
Figure 7:
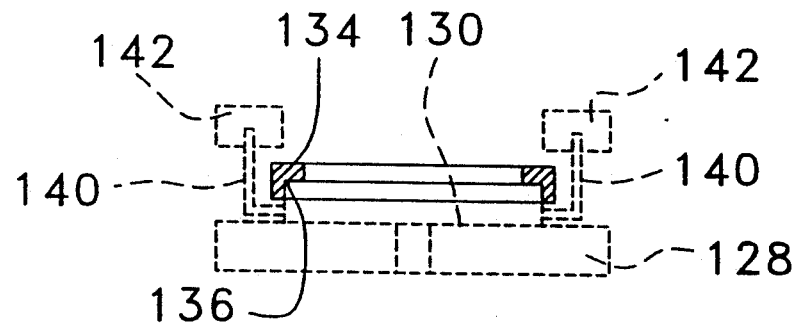
FIG. 7 is a view in cross section of the cradle along lines 7—7 of FIG. 6.

Referring to FIG. 5, the inventive arrangement of CCD chip 130 and its associated wiring is illustrated most clearly. Generally, chip 130 is sandwiched between platform 128 and cradle 134. Cradle 134 is made of Delrin plastic and is positioned within detector housing 26, as illustrated in FIG. 5. As illustrated in FIGS. 6 and 7, cradle 134 includes a chip receiving ledge 136 which matingly fits CCD chip 130 which is sandwiched between the cradle 134 and the copper platform 128 as shown most clearly in FIG. 7. This sandwich is held together by a pair of bolts 138 which screw into holes in cradle 134 and bring chip 130 into good thermal contact with copper platform 128. In this manner, any heat generated by chip 130 is easily conducted away by platform 128 through rod 124 and braided heat sink member 120 to the cold source of Dewar flask 12.

As illustrated in FIG. 7, the conductors 140 of chip 130 extend around cradle 134 allowing them to be inserted int appropriate contact socket members 142. These socket members 142 have output electrical lugs 144 which are attached by solder to a plurality of manganin leads 148 which are substantially radially positioned in relatively short, and where possible, straight lengths from the lugs 144 to vacuum epoxy feedthroughs 150. Generally, the manganin wire used has a thickness of 24–32 gauge, preferably 30 guage. Vacuum feedthroughs 150 are of the type sold by Electrical Industries Corporation of Murray Hill, N.J. and are secured in place using a vacuum service epoxy such as that sold by the Kurt J. Lesker Company of Pittsburgh, Pa. Such a feedthrough generally comprises a central conductor member held within a glass body surrounded by a metal jacket. While the glass appears black, in practice, small amounts of light do pass through the same and, accordingly, it is necessary to have an annular pipe-like cylindrical housing closing member at 152 to block incoming light.

For purposes of clarity of illustration, the wiring 154 to the feedthroughs is not illustrated for purposes of clarity in FIG. 5 but may be seen generally in FIG. 4. Likewise, a heat sensor 156 is shown out of its normal position in FIG. 5. During use, sensor 156 is snugly positioned within a recess in platform 128. Unlike bare manganin wires 148, manganin wires 158 which drive the sensor 156 are contained within Teflon plastic sleeves 160 as illustrated in phantom lines in FIG. 5. The purpose of sleeves 160 is to prevent accidental shorting of wires 158.

For the sake of versatility, additional feedthroughs 150 are provided but which may not be used in a particular wiring embodiment. In connection with this, it is noted that the CCD chip is substantially conventional in nature and forms no part of this invention. Additional output electrical lugs 144 are provided for convenience of wiring and minimization of path length. Insofar as most applications will result in the ability to keep temperatures cooler than necessary, a heater element 164 is positioned within rod 124 as illustrated most clearly in FIG. 5.

During use, light is caused to pass through window 50 in mask 46 through fused silica transparent face 66 onto the light sensitive face 168 of CCD chip 130, as illustrated in FIG. 3. A vacuum is maintained in space 90 and chamber 88, which are in communication with each other by the application of vacuum to orifice 24. The temperature of CCD chip 130 is kept at the desired value by the combined action of the liquid nitrogen 96 which is tempered by the application of power to heater element 164 depending upon the actual temperature measured by heat sensor 156.

Figure 8:
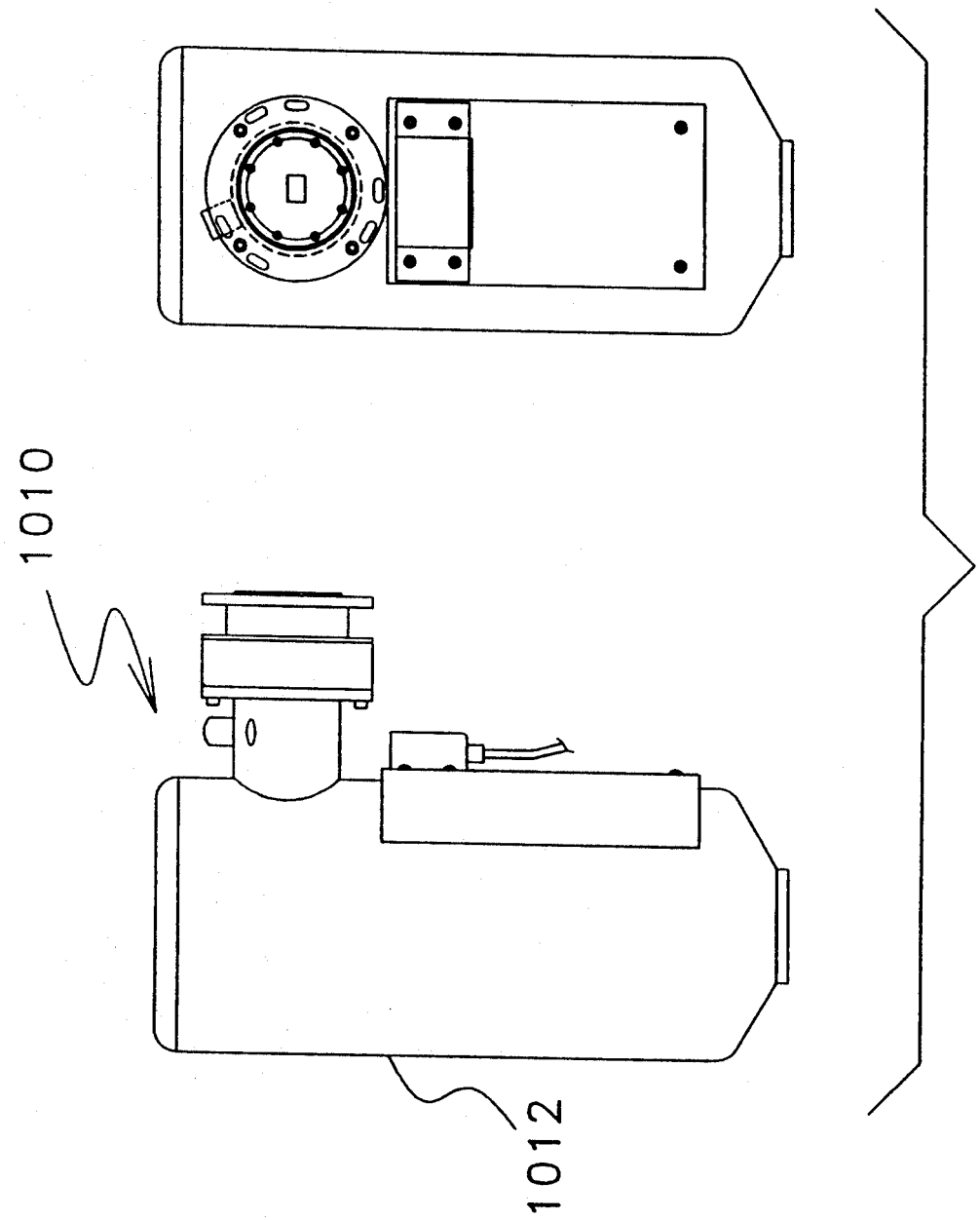
FIG. 8 is a view of an alternative high volume CCD detector.

Referring to FIG. 8, an alternative embodiment is illustrated. Similar parts or parts performing analogous, corresponding or identical functions to those of the FIG. 1 embodiment are numbered herein with numbers which differ from those of the earlier embodiment by the addition of one thousand. In FIG. 8, the Dewar flask optical detector system 1010 is of substantially greater volume, giving a greater cooling capacity and longer detection times at the desired low temperature. Generally, the system is identical except for the use of a larger Dewar flask 1012 having a volume of two liters as compared to the one liter embodiment of FIGS. 1-7.

Figure 9:
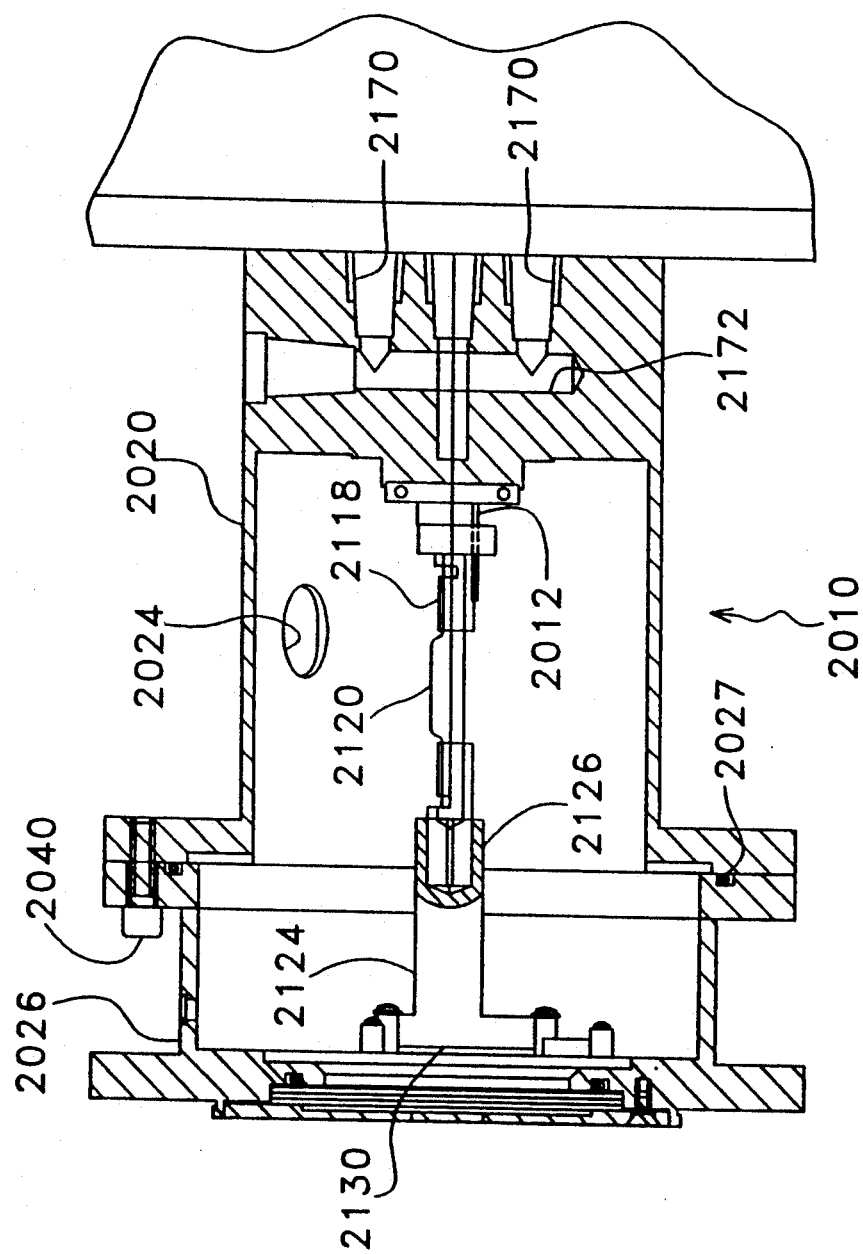
FIG. 9 is a view of still another alternative embodiment of the present invention illustrating only the solid state cooling portions of the system useful with the CCD configuration illustrated in FIG. 5.

Referring to FIG. 9, yet another alternative approach to cooling is shown. Here the system 2010 is substantially identical except for the use of a solid state cooling device 2012 in place of the Dewar flask. In similar fashion to the earlier described embodiments, a chip 2130 is cooled by said solid state cooling device 2012 through the use of a heat conducting path comprising copper members 118, 2126, and 2124, and copper braid 2120. Vacuum is provided via a port 2024 to a turret 2022 which is vacuum sealed to a detector housing 2026 by an O-ring 2027. O-ring 2027 is secured in compression by bolts 2040. Insofar as a solid state cooling device requires cooling of its hot end, orifices 2170 are provided for circulating a coolant through cooling chamber 2172.

While an illustrative embodiment of the invention has been described above, it is, of course, understood that various modifications will be apparent to those of ordinary skill in the art. Such modifications are within the spirit and scope of the invention, which is limited and defined only by the appended claims.

I claim:

1. A low temperature solid state light detecting system comprising:
    (a) a source of cooling;
    (b) an electrical light detector comprising a matrix of light detecting elements;
    (c) a heat conducting member extending from said detector to said source of cooling;
    (d) a vacuum chamber made of a non gassing material for containing said light detector, said chamber having a window for permitting light to fall on said electrical light detector;
    (e) a plurality of electrical feedthrough devices mounted on said chamber for coupling electricity from inside said chamber to the outside of said chamber said electrical feedthrough devices defining a curve; and
    (f) a plurality of bare electrical conductors extending in substantially straight paths from said detector to said feedthrough devices positioned on said chamber, said bare electrical conductors having a relatively poor heat conductive characteristic.

2. A system as in claim 1, wherein said source of cooling comprises a solid state electronic cooling device.

3. A system as in claim 1, wherein said source of cooling comprises a Dewar flask flexibly coupled to said detector.

4. A system as in claim 3, wherein said Dewar flask and said vacuum chamber comprise metal.

5. A system as in claim 3, wherein said vacuum chamber comprises aluminum and is secured to an outer wall of said flask.

6. A system as in claim 1, wherein said light detector is directly wired to said electrical feedthrough devices and said bare electrical conductors are radially disposed with respect to one another.

7. A system as in claim 6, wherein said electrical feedthrough devices are vacuum feedthrough terminals and are electrically connected by said electrical conductors to said electrical light detector without the interposition in the connection path between said light detector and said feedthrough devices of a printed circuit, said electrical conductors being made of manganin.

8. A system as in claim 1, wherein said heat conducting member comprises copper metal braid.

9. A system as in claim 1, wherein said electrical conductors are manganin.

10. A system as in claim 1, wherein the said plurality of bare electrical conductors extend substantially radially from said electrical light detector to said electrical feedthrough devices.

11. A system as in claim 10, wherein said bare electrical conductors generally define a plane.

12. A system as in claim 1, wherein said electrical light detector is supported by a cradle made of thermally insulative material, said electrical light detector having a face for receiving input light and said detector being supported by said cradle with said face in facing spaced relationship to said window, whereby light passing through said window is caused to fall on said detector.

13. A system as in claim 12, wherein said cradle defines a ledge within which said detector fits, said cradle being positioned between said window and said detector, and further comprising a plate made of a material which is highly heat conductive, said plate being positioned on the side of said detector opposite the side on which said cradle is positioned, said plate being joined to said cradle to form a multi-layer structure holding said electrical light detector, said cradle being secured to said vacuum chamber and said plate being thermally coupled to said heat conducting member.

14. A low temperature solid state light detecting system comprising:
    (a) a source of cooling;
    (b) an electrical light detector;
    (c) a heat conducting member extending from said detector to said source of cooling, said heat conducting member comprising:
        (i) a flexible heat conducting metal braid;
        (ii) a rigid heat conducting member connected to said metal braid; and
        (iii) connector means for connecting said flexible heat conducting metal braid and said heat conducting member in a path between said detector and said source of cooling
    (d) a vacuum chamber for containing said light detector, said chamber having a window for permitting light to fall on said electrical light detector;
    (e) a plurality of electrical feedthrough devices mounted on said chamber for coupling electricity from inside said chamber to the outside of said chamber; and
    (f) a plurality of bare electrical conductors extending from said detector to said feedthrough devices positioned on said chamber.

15. A system as in claim 14, wherein said metal braid comprises copper.

16. A system as in claim 14, wherein
    (g) said vacuum chamber is made of a non gassing material;

(h) said plurality of electrical feedthrough devices mounted on said chamber for coupling electricity from inside said chamber to the outside of said chamber define a curve; and (i) said plurality of bare electrical conductors extend in substantially straight paths from said detector to said feedthrough devices positioned on said chamber and have a relatively poor heat conductive characteristic.

17. A system as in claim 16, wherein said electrical light detector is supported by a cradle made of insulative material, said electrical light detector having a face for receiving input light and said detector being supported by said cradle with said face in facing spaced relationship to said window, whereby light passing through said window is caused to fall on said detector.

18. A system as in claim 17, wherein said cradle defines a ledge within which said detector fits, said cradle being positioned between said window and said detector, and further comprising a plate made of a material which is highly heat conductive, said plate being positioned on the side of said detector opposite the side on which said cradle is positioned, said plate being joined to said cradle to form a multi-layer structure holding said electrical light detector, said cradle being secured to said vacuum chamber and said plate being thermally coupled to said heat conducting member.

19. A system as in claim 14, wherein said electrical feedthrough devices are vacuum feedthrough terminals and are electrically connected by said electrical conductors to said electrical light detector without the interposition in the connection path between said light detector and said feedthrough devices of a printed circuit, said electrical conductors being made of manganin.

20. A system as in claim 14, wherein said heat conducting member comprises copper metal braid.

21. A system as in claim 14, wherein the said plurality of bare electrical conductors extend substantially radially from said electrical light detector to said electrical feedthrough devices.

22. A low temperature solid state light detecting system comprising:

(a) a source of cooling comprising a Dewar flask comprising:

(i) an inner envelope for containing a cold material;

(ii) an outer wall generally surrounding said inner envelope, said outer wall defining an opening which overlies an exposed portion of said inner envelope;

(b) an electrical light detector;

(c) a vacuum chamber for containing said light detector, said chamber having a window for permitting light to fall on said electrical light detector, said vacuum chamber comprising:

(i) a shell configured and dimensioned to be secured to said outer shell of said Dewar flask and to contain said electrical light detector;

(d) a heat conducting member extending from said detector to said inner envelope of said Dewar flask;

(e) a plurality of electrical feedthrough devices mounted on said chamber for coupling electricity from inside said chamber to the outside of said chamber; and (f) a plurality of bare electrical conductors extending from said detector to said feedthrough devices positioned on said chamber.

23. A system as in claim 22, wherein said electrical light detector is supported by a cradle made of insulative material, said electrical light detector having a face for receiving input light and said detector being supported by said cradle with said face in facing spaced relationship to said window, whereby light passing through said window is caused to fall on said detector.

24. A system as in claim 23, wherein said cradle defines a ledge within which said detector fits, said cradle being positioned between said window and said detector, and further comprising a plate made of a material which is highly heat conductive, said plate being positioned on the side of said detector opposite the side on which said cradle is positioned, said plate being joined to said cradle to form a multi-layer structure holding said electrical light detector, said cradle being secured to said vacuum chamber and said plate being thermally coupled to said heat conducting member.

25. A system as in claim 22, wherein said electrical feedthrough devices are vacuum feedthrough terminals and are electrically connected by said electrical conductors to said electrical light detector without the interposition in the connection path between said light detector and said feedthrough devices of a printed circuit, said electrical conductors being made of manganin.

26. A system as in claim 22, wherein said heat conducting member comprises copper metal braid.

27. A system as in claim 22, wherein the said plurality of bare electrical conductors extend substantially radially from said electrical light detector to said electrical feedthrough devices.

* * * * *